(12) United States Patent
Simin et al.

(10) Patent No.: US 10,964,862 B2
(45) Date of Patent: Mar. 30, 2021

(54) SEMICONDUCTOR HETEROSTRUCTURE WITH MULTIPLE ACTIVE REGIONS

(71) Applicant: Sensor Electronic Technology, Inc., Columbia, SC (US)

(72) Inventors: Grigory Simin, Columbia, SC (US); Michael Shur, Latham, NY (US); Alexander Dobrinsky, Silver Spring, MD (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/720,352

(22) Filed: Sep. 29, 2017

(65) Prior Publication Data

US 2018/0097157 A1    Apr. 5, 2018

Related U.S. Application Data

(60) Provisional application No. 62/403,052, filed on Sep. 30, 2016.

(51) Int. Cl.

| | |
|---|---|
| *H01L 33/58* | (2010.01) |
| *H01L 31/0232* | (2014.01) |
| *H01L 31/0236* | (2006.01) |
| *H01L 33/08* | (2010.01) |
| *H01L 31/12* | (2006.01) |
| *H01L 31/0352* | (2006.01) |
| *H01L 31/101* | (2006.01) |
| *H01L 33/32* | (2010.01) |

(52) U.S. Cl.
CPC .......... *H01L 33/58* (2013.01); *H01L 31/0232* (2013.01); *H01L 31/0236* (2013.01); *H01L 31/02322* (2013.01); *H01L 31/035236* (2013.01); *H01L 31/1013* (2013.01); *H01L 31/12* (2013.01); *H01L 33/08* (2013.01); *H01L 33/32* (2013.01)

(58) Field of Classification Search
None
See application file for complete search history.

(56) References Cited

U.S. PATENT DOCUMENTS

| | | | | |
|---|---|---|---|---|
| 7,067,853 | B1 * | 6/2006 | Yao | H01L 27/14681 257/184 |
| 7,435,998 | B2 * | 10/2008 | Kondo | H01L 21/6835 257/100 |
| 2004/0036078 | A1 * | 2/2004 | Kondo | H01L 21/6835 257/80 |
| 2007/0241260 | A1 * | 10/2007 | Jaeger | H01L 31/02162 250/214.1 |

(Continued)

*Primary Examiner* — Abul Kalam
(74) *Attorney, Agent, or Firm* — LaBatt, LLC

(57) ABSTRACT

A semiconductor heterostructure for an optoelectronic device includes a base semiconductor layer having one or more semiconductor heterostructure mesas located thereon. One or more of the mesas can include a set of active regions having multiple main peaks of radiative recombination at differing wavelengths. For example, a mesa can include two or more active regions, each of which has a different wavelength for the corresponding main peak of radiative recombination. The active regions can be configured to be operated simultaneously or can be capable of independent operation. A system can include one or more optoelectronic devices, each of which can be operated as an emitter or a detector.

20 Claims, 11 Drawing Sheets

(56) References Cited

U.S. PATENT DOCUMENTS

| | | | | |
|---|---|---|---|---|
| 2010/0258892 A1* | 10/2010 | Butendeich | ....... | H01L 31/03529 |
| | | | | 257/440 |
| 2011/0303896 A1* | 12/2011 | Brandes | .............. | H01L 25/0753 |
| | | | | 257/13 |
| 2013/0175500 A1* | 7/2013 | Cho | ........................ | B82Y 20/00 |
| | | | | 257/21 |
| 2013/0181619 A1* | 7/2013 | Tischler | ................ | H01L 27/156 |
| | | | | 315/185 R |
| 2014/0124730 A1* | 5/2014 | Choi | ........................ | H01L 33/10 |
| | | | | 257/13 |
| 2016/0010805 A1* | 1/2016 | Tischler | ................ | H01L 27/156 |
| | | | | 362/231 |
| 2016/0359300 A1* | 12/2016 | El-Ghoroury | ............ | H01L 33/06 |
| 2017/0047483 A1* | 2/2017 | Kim | ........................ | H01L 33/20 |
| 2017/0345958 A1* | 11/2017 | Meyer | ............... | H01L 31/02161 |

* cited by examiner

SEMICONDUCTOR HETEROSTRUCTURE WITH MULTIPLE ACTIVE REGIONS

REFERENCE TO RELATED APPLICATIONS

The current application claims the benefit of U.S. Provisional Application No. 62/403,052, filed on 30 Sep. 2017, which is hereby incorporated by reference.

TECHNICAL FIELD

The disclosure relates generally to semiconductor heterostructures, and more particularly, to a semiconductor heterostructure having multiple active regions.

BACKGROUND ART

Solid state optoelectronic devices are frequently used to sense changes in biological fluids and to analyze chemical substances. In particular, fluorescent analysis is frequently used to determine the chemical components present within a medium.

SUMMARY OF THE INVENTION

Aspects of the invention are directed to the design and/or fabrication of a solid state optoelectronic device having multiple active regions. In an embodiment, such devices and a system of one or more of such devices can provide effective fluorescent analysis using multiple wavelengths, in particular wavelengths in the ultraviolet range. Further aspects of the invention are directed to a tandem of a multi-wavelength light emitting diode and a multi-wavelength photodiode, e.g., for fluorescent analysis and/or sensing applications.

An embodiment of a device described herein can have a semiconductor heterostructure containing several active regions. Each active region in the semiconductor heterostructure can have a corresponding main peak of radiative recombination at a different peak wavelength. In this case, the device can provide multiple solidly connected active regions capable of operating as an emitter and/or a detector at several peak wavelengths simultaneously. In another embodiment, a semiconductor heterostructure can include an active region that includes subsets of quantum wells having corresponding main peaks of radiative recombination at different peak wavelengths. In either case, the device can be capable of operating as an emitter and/or a detector at several peak wavelengths simultaneously.

Aspects of the invention provide a semiconductor heterostructure for an optoelectronic device includes a base semiconductor layer having one or more semiconductor heterostructure mesas located thereon. One or more of the mesas can include a set of active regions having multiple main peaks of radiative recombination at differing wavelengths. For example, a mesa can include two or more active regions, each of which has a different wavelength for the corresponding main peak of radiative recombination. The active regions can be configured to be operated simultaneously or can be capable of independent operation. A system can include one or more optoelectronic devices, each of which can be operated as an emitter or a detector.

A first aspect of the invention provides a semiconductor heterostructure comprising: a base semiconductor layer having a plurality of physically separate semiconductor heterostructure mesas located thereon, wherein each of the plurality of mesas includes at least one active region having a main peak of radiative recombination, and wherein at least one of the plurality of mesas includes: a first active region having a first main peak of radiative recombination at a first wavelength and a first full width at half maximum; and a second active region having a second main peak of radiative recombination at a second wavelength and a second full width at half maximum, wherein the first wavelength and the second wavelength differ by at least a larger of the first full width at half maximum or the second full width at half maximum.

A second aspect of the invention provides an optoelectronic device comprising: a base semiconductor layer having a semiconductor heterostructure mesa located on a first surface of the base semiconductor layer, wherein the mesa includes a plurality of active regions, each active region having a main peak of radiative recombination, and wherein the plurality of active regions include: a first active region having a first main peak of radiative recombination at a first wavelength and a first full width at half maximum; and a second active region having a second main peak of radiative recombination at a second wavelength and a second full width at half maximum, wherein the first wavelength and the second wavelength differ by at least a larger of the first full width at half maximum or the second full width at half maximum.

A third aspect of the invention provides a system comprising: a first optoelectronic device comprising: a base semiconductor layer having a semiconductor heterostructure mesa located on a first surface of the base semiconductor layer, wherein the mesa includes a plurality of active regions, each active region having a main peak of radiative recombination, and wherein the plurality of active regions include: a first active region having a first main peak of radiative recombination at a first wavelength and a first full width at half maximum; and a second active region having a second main peak of radiative recombination at a second wavelength and a second full width at half maximum, wherein the first wavelength and the second wavelength differ by at least a larger of the first full width at half maximum or the second full width at half maximum; and a second optoelectronic device, wherein one of the first or second optoelectronic devices is configured to be operated as an emitter and the other of the first or second optoelectronic devices is configured to be operated as a detector.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a semiconductor heterostructure for an optoelectronic device includes a base semiconductor layer having one or more semiconductor heterostructure mesas located thereon. One or more of the mesas can include a set of active regions having multiple main peaks of radiative recombination at differing wavelengths. For example, a mesa can include two or more active regions, each of which has a different wavelength for the corresponding main peak of radiative recombination. The active regions can be configured to be operated simultaneously or can be capable of independent operation. A system can include one or more optoelectronic devices, each of which can be operated as an emitter or a detector.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/− ten percent of the stated value, while the term "substantially" is inclusive of values within +/− five percent of the stated value.

As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength +/− five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/− one percent).

Figure 1:
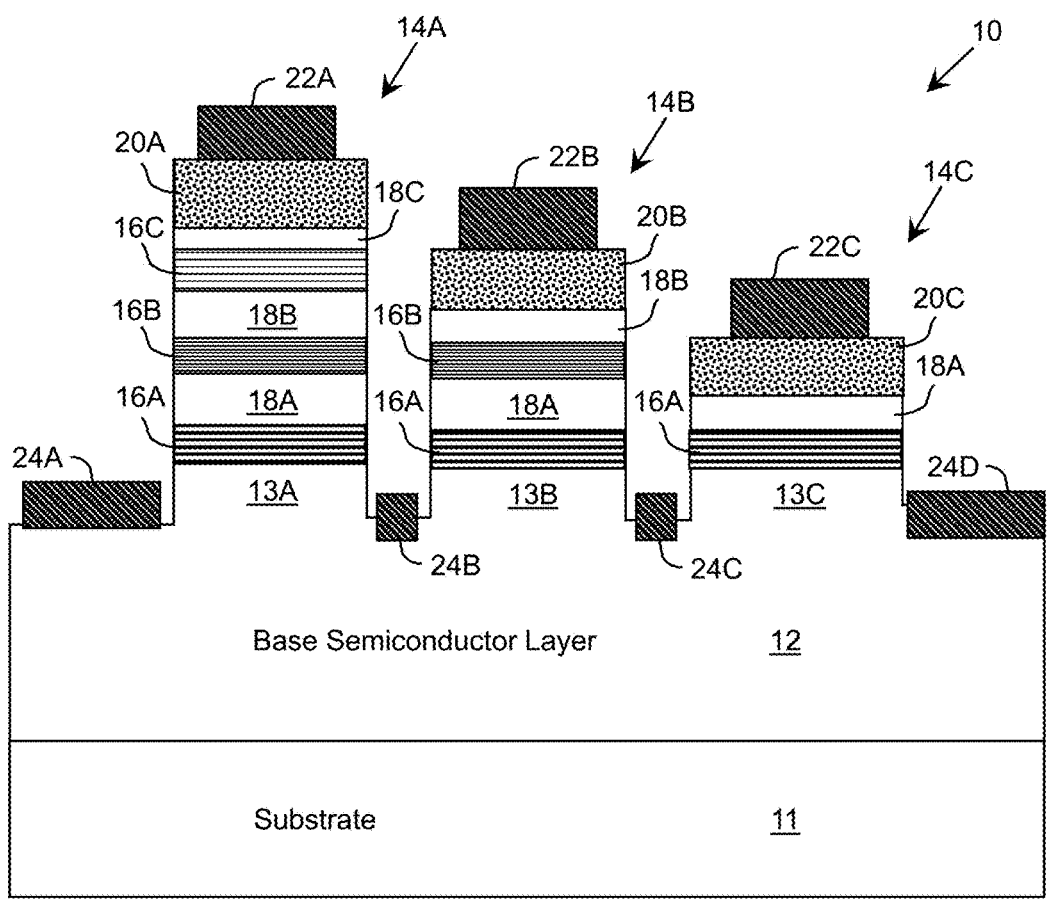
FIG. 1 shows a schematic of an illustrative optoelectronic device according to an embodiment.

Turning to the drawings, FIG. 1 shows a schematic of an illustrative optoelectronic device 10 according to an embodiment. The device 10 is shown including a base semiconductor layer 12 located on a substrate 11. A plurality of mesas 14A-14C are located on the base semiconductor layer 12. Each mesa 14A-14C includes a corresponding region 13A-13C of the base semiconductor layer 12 located at the bottom of the mesa 14A-14C, followed by one or more active regions 16A-16C. Each active region 16A-16C in a mesa 14A-14C is bounded by one or more semiconductor layers 18A-18C. Each mesa 14A-14C can further include a corresponding semiconductor contact layer 20A-20C and a corresponding contact 22A-22C.

In an embodiment, the base semiconductor layer 12 comprises a semiconductor layer having one of an n-type or a p-type conductivity. In this case, the device 10 can include a set of contacts 24A-24D to the base semiconductor layer 12. For example, as illustrated, contacts 24A-24D can be located directly on the same surface of the base semiconductor layer 12 as the mesas 14A-14C in regions where the mesas 14A-14C are not present. While each contact 24A-24D is shown as being physically separated from the mesas 14A-14C, it is understood that a sidewall of a contact 24A-24D can contact a sidewall of one or more mesas 14A-14C, e.g., the sidewall of one or more of the regions 13A-13C of the base semiconductor layer 12. In a more particular embodiment, the base semiconductor layer 12 is an n-type semiconductor contact layer and the contacts 24A-24D are n-type contacts. In this case, the semiconductor contact layer 20A-20C in each mesa 14A-14C can be a p-type semiconductor contact layer and the contacts 22A-22C can be p-type contacts.

The device 10 can comprise any type of optoelectronic device. In an embodiment, the optoelectronic device 10 is configured to operate as an emitting device, such as a light emitting diode (LED) or a laser diode (LD), having multiple peak emission wavelengths. Alternatively, the optoelectronic device 10 can operate as a sensing device, such as a photodiode, sensitive at multiple peak sensing wavelengths. Still further, the optoelectronic device 10 can be configured to concurrently operate as an emitting and sensing device. Regardless, during operation of the optoelectronic device 10, application of a bias to the p-type and n-type contacts 22A-22C, 24A-24D comparable to the band gap can result in the emission of electromagnetic radiation from one or more of the active regions 16A-16C of the optoelectronic device 10. Alternatively, impingement of electromagnetic radiation on one or more of the active regions 16A-16C can result in a bias in one or more of the active regions 16A-16C, which can be detected at the p-type and n-type contacts 22A-22C, 24A-24D.

In an embodiment, one or more of the active regions 16A-16C is formed from a series of alternating quantum wells and barriers. The electromagnetic radiation emitted or sensed by each active region 16A-16C of the optoelectronic device 10 can have a peak wavelength within any range of wavelengths, including visible light, ultraviolet radiation, deep ultraviolet radiation, infrared light, and/or the like. In an embodiment, one or more of the active regions 16A-16C of the device 10 is configured to emit or sense radiation having a dominant wavelength within the ultraviolet range of wavelengths. In a more specific embodiment, the dominant wavelength is within a range of wavelengths between approximately 210 and approximately 360 nanometers (between approximately 250 and approximately 310 nanometers in a still more specific embodiment).

Each active region 16A-16C can be designed such that a main peak of radiative recombination has a target peak wavelength. In an embodiment, the first active region 16A can have first composition and thickness of quantum wells and barriers; whereas the second active region 16B can have a different composition and/or thickness of quantum wells and barriers resulting in different radiation or absorption properties of the active region 16B as compared to the active regions 16A. To this extent, each active region 16A-16C in a mesa 14A-14C can be independently designed to have a corresponding target peak wavelength. In an embodiment, the first, second, third, etc., active region 16A-16C in each mesa 14A-14C is configured to have the same peak wavelength. However, it is understood that this is not necessary, and each active region in each mesa can be uniquely configured. Furthermore, it is understood that embodiments of the device 10 can include any combination of active regions, including all active regions, which are configured to have the same target peak wavelength.

When the peak wavelengths for two or more active regions of a mesa differ, the peak wavelengths can differ by an amount that exceeds any unintentional difference that results from a manufacturing process used in fabricating the device 10. For example, two active regions can have first and second main peaks of radiative recombination at first and second wavelengths and first and second full widths at half maximum, respectively. In an embodiment, the first wavelength and the second wavelength differ by at least a larger of the first full width at half maximum (FWHM) or the second full width at half maximum. In an embodiment, the first and second wavelengths can be in distinct regions (e.g., visible, ultraviolet, infrared, etc.) of the electromagnetic spectrum.

In an illustrative embodiment, the optoelectronic device 10 is a group III-V materials based device, in which some or all of the various semiconductor layers are formed of elements selected from the group III-V materials system. In a more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_wAl_xGa_yIn_zN$, where $0 \le w, x, y, z \le 1$, and $w+x+y+z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

Illustrative group III nitride based active regions 16A-16C include $In_yAl_xGa_{1-x-y}N$, $Ga_zIn_yAl_xB_{1-x-y-z}N$, an $Al_xGa_{1-x}N$ semiconductor alloy, or the like. Similarly, each of the various semiconductor layers 12, 18A-18C, 20A-20C of the device 10 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 12, 16A-16C, 18A-18C, 20A-20C. The molar fractions can be selected based on the desired attributes of the layer and/or the corresponding wavelength for electromagnetic radiation corresponding to the optoelectronic device 10. For example, the molar fractions for the active regions 16A-16C can be selected to emit and/or sense electromagnetic radiation of a target wavelength, while the molar fractions for the remaining layers 12, 18A-18C, 20A-20C can be selected to result in manageable stresses in the active regions 16A-16C. It is understood that embodiments of the optoelectronic device 10 can include multiple layers for one or more of the semiconductor layers 12, 18A-18C, 20A-20C shown and described herein.

The substrate 11 can be composed of a material that is transparent to the electromagnetic radiation corresponding to (e.g., emitted or sensed by) the optoelectronic device 10. Additionally, the substrate 11 can be formed of a material suitable for growth of the corresponding semiconductor (e.g., group III nitride) materials thereon. To this extent, an embodiment of the substrate 11 is formed of sapphire. However, it is understood that the substrate 11 can be formed of any suitable material including, for example, silicon carbide (SiC), silicon (Si), bulk GaN, bulk AlN, bulk or a film of AlGaN, bulk or a film of BN, AlON, $LiGaO_2$, $LiAlO_2$, aluminum oxinitride ($AlO_xN_y$), $MgAl_2O_4$, GaAs, Ge, or another suitable material. Furthermore, one or more surfaces of the substrate 11 can be substantially flat or patterned using any solution. Such patterning can be designed to facilitate quality growth of a semiconductor layer thereon and/or passage of electromagnetic radiation through the surface.

Each of the semiconductor layers in the mesas 14A-14C can be configured to provide any type of desired functionality. For example, a semiconductor layer 12, 18A-18C adjacent to the active region 16A-16C closest to the n-type side of the device can comprise a cladding layer, an electron supply layer, a contact layer, and/or the like. Similarly, a semiconductor layer 12, 18A-18C adjacent to the active region 16A-16C closest to the p-type side of the device can comprise an electron blocking layer, a cladding layer, a hole supply layer, a contact layer, and/or the like.

In an embodiment the p-n junction is fabricated in the top portion of each mesa 14A-14C, resulting in significant luminescence of the top active layer in the corresponding mesa, e.g., active layer 16C in the mesa 14A, active layer 16B in the mesa 14B, and active layer 16A in the mesa 14C. With such a configuration, a semiconductor layer located between two active layers, such as the semiconductor layer 18A in mesas 14A, 14B and the semiconductor layer 18B in the mesa 14A, can be n-type doped, while the topmost semiconductor layer (e.g., semiconductor layer 18C in the mesa 14A) is p-type doped. Regardless, the n-type semiconductor layers of the device 10 can be configured to be transparent to the radiation corresponding to any one of the active layers 16A-16C. To this extent, a bandgap for each n-type semiconductor layer can be wider than the bandgap of any of the quantum wells in any of the active layers 16A-16C.

In an embodiment, one or more of the semiconductor layers 12, 18A-18C can comprise a short period superlattice lattice structure, such as an at least partially transparent magnesium (Mg)-doped AlGaN/AlGaN short period superlattice structure (SPSL) on the p-type side or an AlGaN SPSL on the n-type side, which is transparent to the electromagnetic radiation generated and/or sensed by the active regions 16A-16C. In an embodiment, an n-type semiconductor layer, such as the base semiconductor layer 12 or a contact layer 20A-20C, is n-type doped with a carrier concentration being at least $10^{17}$ $1/cm^3$. In an embodiment the p-type doping can be at least $10^{17}$ $1/cm^3$, and more particularly in a range of approximately $10^{18}$-$10^{19}$ 1/cm$^3$. In an embodiment, a p-type layer, such as the base semiconductor layer 12 or the contact layer 20A-20C, can comprise a p-type doped GaN, p-type AlGaN, a p-type $Al_xGa_{1-x}N$/$Al_yGa_{1-y}N$ semiconductor superlattice, with x and y values being different by at least 1% but preferably by 5% or more, and/or the like.

Each contact 22A-22C, 24A-24D can form an ohmic contact to the corresponding semiconductor layer. In an embodiment, one or more of the contacts 22A-22C, 24A-24D comprises several conductive and reflective metal layers. Alternatively, one or more of the contacts 22A-22C, 24A-24D can comprise a highly conductive metal.

It is understood that the device 10 is only illustrative of various possible configurations for a device described herein. For example, the number of and layer configurations of mesas 14A-14C are only illustrative. To this extent, a device described herein can include additional semiconductor layers in the heterostructure, fewer semiconductor layers, and/or different configurations of semiconductor layers. An illustrative semiconductor layer can comprise a buffer layer, which can be epitaxially grown directly on the substrate 11. The base semiconductor layer 12 can subsequently be epitaxially grown on the buffer layer. For an illustrative group III nitride based heterostructure, such a buffer layer can comprise an AlN layer and the base semiconductor layer 12 can comprise an n-type AlGaN layer.

Figure 2A:
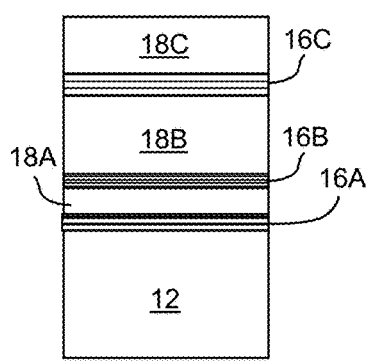
FIGS. 2A-2D show an illustrative series of fabrication acts for fabricating an optoelectronic device according to an embodiment.
Figure 2B:
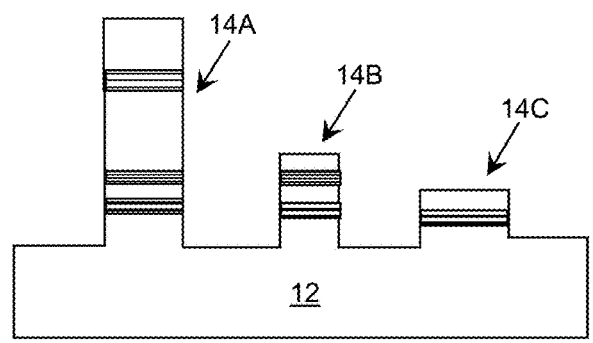

A device described herein can be fabricated using any solution. FIGS. 2A-2D show an illustrative series of fabrication acts for fabricating an optoelectronic device according to an embodiment. As illustrated in FIG. 2A, a semiconductor heterostructure can be formed, which includes a base semiconductor layer 12, multiple active regions 16A-16C, and intervening semiconductor layers 18A-18C using any growth solution. For example, the various semiconductor layers can be epitaxially grown on a substrate 11 (FIG. 1) using any epitaxial growth solution.

Subsequently, the semiconductor heterostructure can be selectively etched to form the mesas 14A-14C, each of which is located directly on a surface of the base semiconductor layer 12. As illustrated, the etching can extend into a top surface of the base semiconductor layer 12 in regions located between the mesas 14A-14C. Additionally, the amount of etching can vary among the mesas 14A-14C. To this extent, the etching can include removing one or more of the originally grown semiconductor layers 18A-18C and/or active regions 16A-16C from one or more of the mesas 14A-14C.

In an embodiment, the etching process includes selectively adding masking materials after a desired amount of material has been etched. For example, initially, a masking material can be applied to a top surface of the mesa 14A and the remainder of the semiconductor heterostructure can be etched. The etching can continue until the a desired top of the second mesa 14B, at which time a masking material can be applied to the top of the second mesa 14B and etching can resume. Subsequently, once exposed, a masking material can be applied to a top surface for the third mesa 14C and etching can resume until a desired amount of the base semiconductor layer 12 has been etched. Subsequently, the masking material can be removed from the top surface of each mesa 14A-14C using any solution. The etching can be performed using a suitable etching process, such as reactive ion etching, dry etching in $Cl_2/N_2/O_2$ plasma or $Cl_2$/Ar based inductively coupled plasma, and/or the like. The masking material can comprise any suitable masking material, such as any of various photoresists known in the art.

Figure 2C:
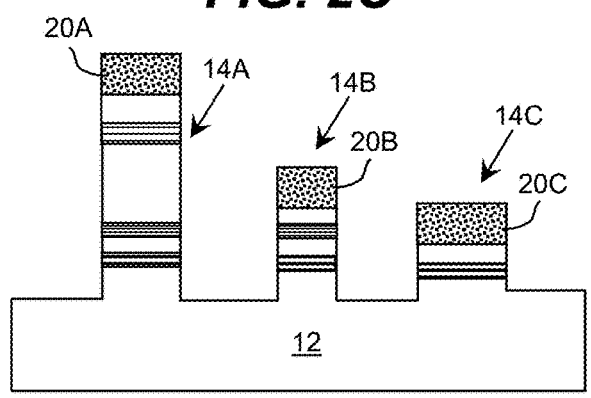

As illustrated in FIG. 2C, one or more semiconductor layers, such as the contact layers 20A-20C, can be formed on the mesas 14A-14C using any solution. For example, the contact layers 20A-20C can be formed using an epitaxial overgrowth process. In this case, a photolithographic mask can be applied to the regions between the mesas 14A-14C to prevent growth of the semiconductor thereon. Subsequently, the contact layers 20A-20C can be grown on the top surface of each mesa 14A-14C, followed by the removal of the photoresist material from the surfaces of the base semiconductor layer 12 using any suitable photoresist removal solvent known in the art.

Figure 2D:
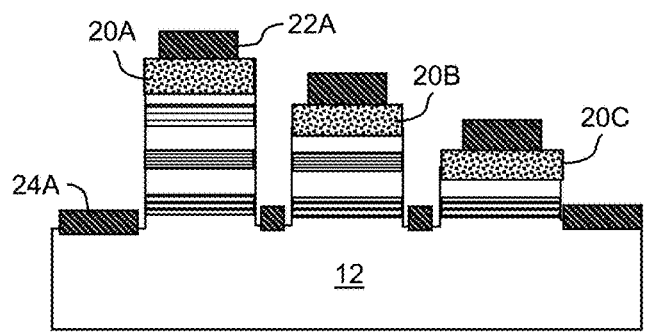

In FIG. 2D, the metal contacts, such as metal contacts 22A, 24A, are deposited over the corresponding semiconductor layers. For example, metal contacts 24A (e.g., n-type contacts) can be deposited on the surface of the base semiconductor layer 12, while metal contacts 22A (e.g., p-type contacts) can be deposited on the surface of each contact layer 20A-20C. The metal contacts can be selected depending on the type of ohmic contact (n-type or p-type) for the corresponding metal contact. For example, the metal contacts 24A can comprise n-type metal(s) such as Ti, Al, and/or the like, while the metal contacts 22A can comprise p-type metal(s) such as Ni, Pd, and/or the like. The metal contacts 22A, 24A can be deposited using a photolithographic process through evaporation or sputtering.

It is understood that the growth process shown in FIGS. 2A-2D is only illustrative of various possible growth processes. In an embodiment, such as when the p-n junction is formed in the top portion of each mesa, only the various semiconductor layers of a first type of doping, e.g., n-type doping, can be grown prior to performing the etching shown in FIG. 2B. For example, as discussed herein, when the semiconductor layer 18C is p-type doped, growth of the semiconductor layer 18C can occur after etching, e.g., prior to the growth of the contact layers 20A-20C as shown in FIG. 2C.

Figure 3A:
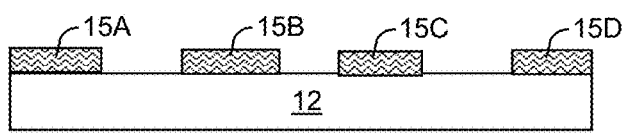
FIGS. 3A-3E show an illustrative series of fabrication acts for fabricating a heterostructure using progressive masking to form mesas according to an embodiment.
Figure 3B:
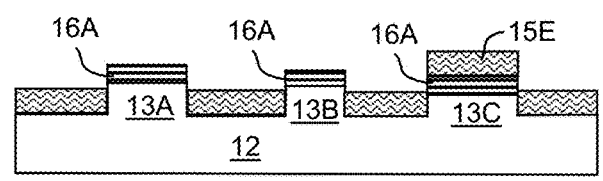
Figure 3C:
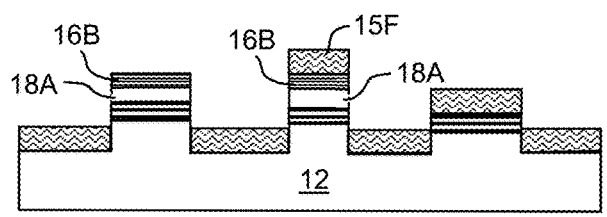
Figure 3D:
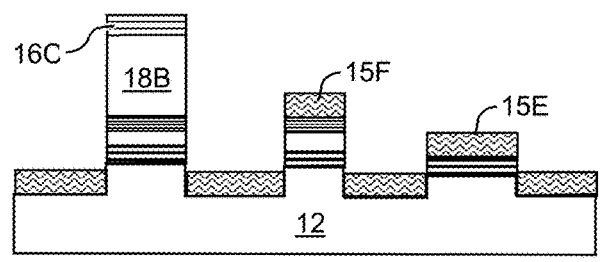
Figure 3E:
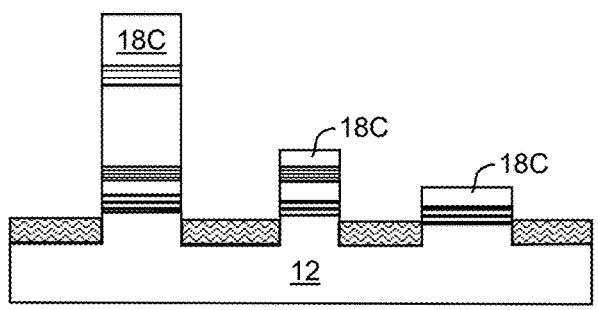

FIGS. 3A-3E show an illustrative series of fabrication acts for fabricating a heterostructure using progressive masking to form mesas according to an embodiment. In this case, as shown in FIG. 3A, the base semiconductor layer 12 can be grown, followed by deposition of masking layers 15A-15D on the regions of the base semiconductor layer 12 that will be located between the mesas. As shown in FIG. 3B, the regions 13A-13C and the active layer 16A can be grown, followed by depositing a masking layer 15E on the active region 16A in the third mesa. Next, as shown in FIG. 3C, semiconductor layer 18A and active region 16B can be grown, followed by depositing a masking layer 15F on the active region 16B in the second mesa. As shown in FIG. 3D, the semiconductor layer 18B and active region 16C can be grown, followed by removal of the masking layers 15E, 15F from the other mesas. In FIG. 3E, the semiconductor layer 18C can be grown on each mesa with a doping (e.g., p-type) opposite that of the previously grown (e.g., n-type doped) semiconductor layers. Further fabrication of the device can proceed similar to the process described in conjunction with FIGS. 2C and 2D.

Figure 4:
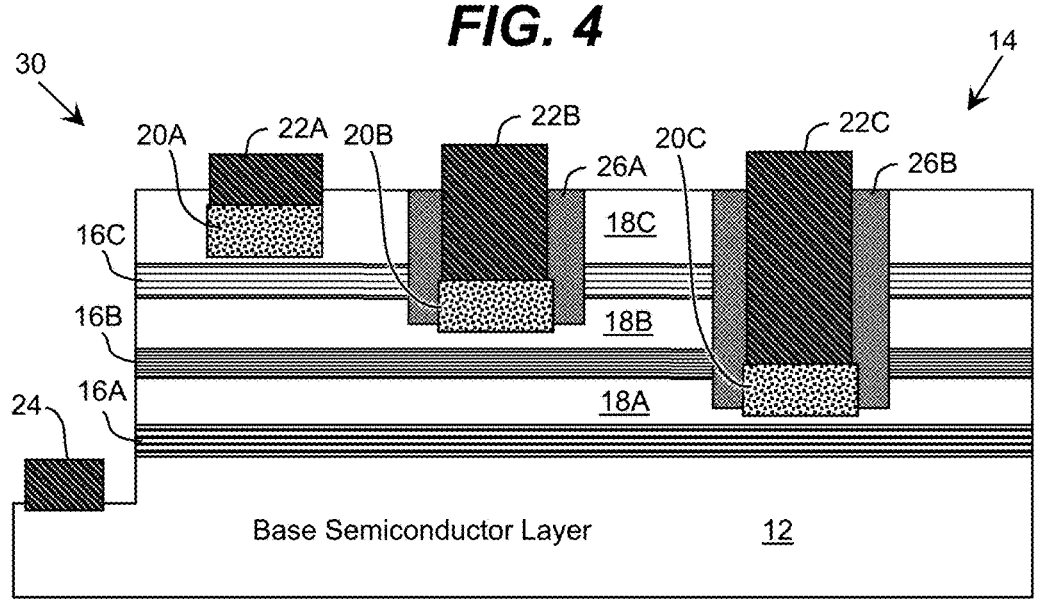
FIG. 4 shows an illustrative device including a mesa with cavities formed therein according to an embodiment.

Embodiments of a device described herein can be fabricated using one or more cavities to provide access to an active region. For example, FIG. 4 shows an illustrative device 30 including a mesa with cavities formed therein according to an embodiment. In this case, the device 30 is shown including a single mesa 14 located directly on a surface of a base semiconductor layer 12. The mesa 14 includes multiple active regions 16A-16C, each of which has a corresponding contact layer 20A-20C and metal contact 22A-22C thereto. Additionally, a metal contact 24 is shown located on the surface of the base semiconductor layer 12 next to the mesa 14.

In an embodiment, the mesa 14 is formed by first forming (e.g., growing) the plurality of active regions 16A-16C and corresponding semiconductor layers 18A-18C on the base semiconductor layer 12. Subsequently, a plurality of cavities can be formed in the mesa, each cavity extending to a depth just above that of a corresponding active region 16A-16C using any solution (e.g., repeated acts of masking and etching followed by removal of the masking material). Next, the contact layers 20A-20C can be formed within the cavities, e.g., by epitaxial overgrowth.

When a cavity extends through one or more active regions to reach an underlying active region, the sidewalls of the cavity can be covered with a dielectric material 26A, 26B using any solution, such as sputtering, chemical vapor deposition (CVD), etc. The dielectric material can comprise any suitable dielectric material, such as silicon dioxide, silicon nitride, aluminum nitride, and/or the like. Subsequently, the metal contacts 22A-22C can be formed (e.g., deposited) in the cavities using any solution.

While the device 30 is shown including a single mesa 14, it is understood that embodiments of a device described herein can include any number of mesas, each of which includes one or more active regions. Additionally, for each such mesa including multiple active regions, the mesa can include multiple contacts 22A-22C formed in cavities in the mesa as shown in conjunction with the device 30. To this extent, an embodiment of the device 10 shown in FIG. 1 can include a mesa, such as the mesa 14A, including cavities and multiple contacts 22A-22C as shown in conjunction with the device 30.

Figure 5:
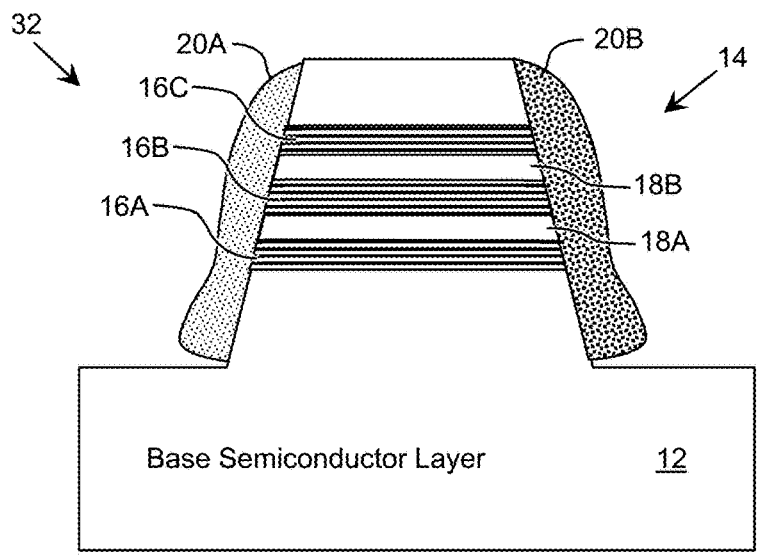
FIG. 5 shows an illustrative device including contact layers formed on the sidewalls of a mesa according to an embodiment.

In an embodiment, a sidewall of a mesa can be used to provide access to the multiple active regions located therein. To this extent, FIG. 5 shows an illustrative device 32 including semiconductor contacts layers 20A, 20B formed on the sidewalls of a mesa 14 according to an embodiment. In this case, the mesa 14 includes active regions 16A-16C, which are separated by semiconductor layers 18A, 18B that can contain no intentional doping. The base semiconductor layer 12 in this embodiment can comprise a buffer layer. As discussed herein, each active region 16A-16C can be configured to operate at a distinct peak wavelength. Current is injected laterally through the semiconductor contact layers 20A, 20B formed on the side walls of the mesa 14 with the p-n junction formed laterally.

In an embodiment, the semiconductor contact layer 20A can comprise an n-type semiconductor contact layer (e.g., n-type cladding layer) that can be epitaxially overgrown over a first side of the mesa 14, while the semiconductor contact layer 20B can comprise a p-type semiconductor contact layer (e.g., p-type cladding layer) that can be epitaxially overgrown over a second side of the mesa 14. The epitaxial overgrowth can be improved when the mesa 14 has inclined sidewalls as illustrated. In an embodiment, the angle of inclination of at least a portion of a sidewall of the mesa 14 can be between 10 to 80 degrees. However, it is understood that other angles (including vertical sidewalls) can be utilized. The mesa 14 can be fabricated by first growing a semiconductor heterostructure and then etching to form the mesa 14. Such etching can be due to particular composition of layers as is known in the art. For example, the etching of GaN layers has a higher rate than etching of AlGaN layers with high composition of AlN.

The n-type and p-type semiconductor contact layers 20A, 20B can be contacted by corresponding metallic contacts, which can be operated to result in current passing through the mesa 14. For efficient operation of the mesa 14, the lateral dimension (e.g., maximum lateral distance) between the n-type and p-type semiconductor contact layers 20A, 20B can be comparable to the carrier diffusion length within the active regions 16A-16C, such as the hole diffusion length, as it is the smallest diffusion length in the device. As used herein, the lateral dimension is comparable to the hole diffusion length with it is within an order of magnitude of the hole diffusion length. To this extent, the lateral dimension can be several times larger or smaller than the hole diffusion length. It is understood that due to sufficiently wide ranges, the hole diffusion length can be taken as the smallest hole diffusion length calculated over all the layers of the semiconductor heterostructure of all the active regions presented in the device. The hole diffusion length can be calculated as $\sqrt{D\tau}$, where D is the diffusion coefficient and $\tau$ is the carrier lifetime. The diffusion coefficient is directly proportional to the mobility of the carriers within the semiconductor heterostructure. It is feasible for the mesa 14 to have sub-micron or micron lateral dimension, for optimal operation of the lateral injection within the mesa 14.

Figure 6A:
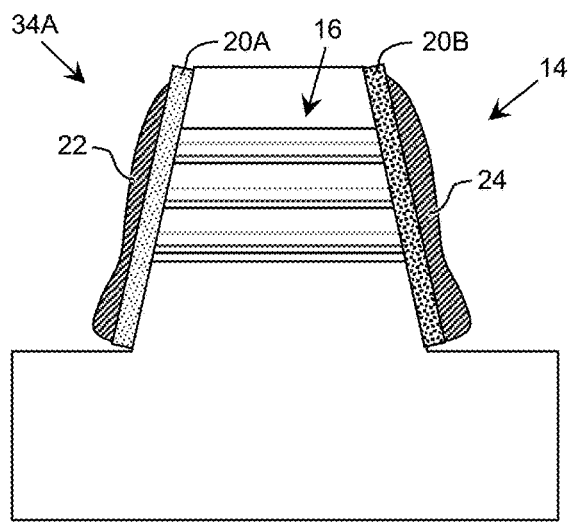
FIGS. 6A and 6B show variations of devices having a mesa with lateral current injection according to embodiments.
Figure 6B:
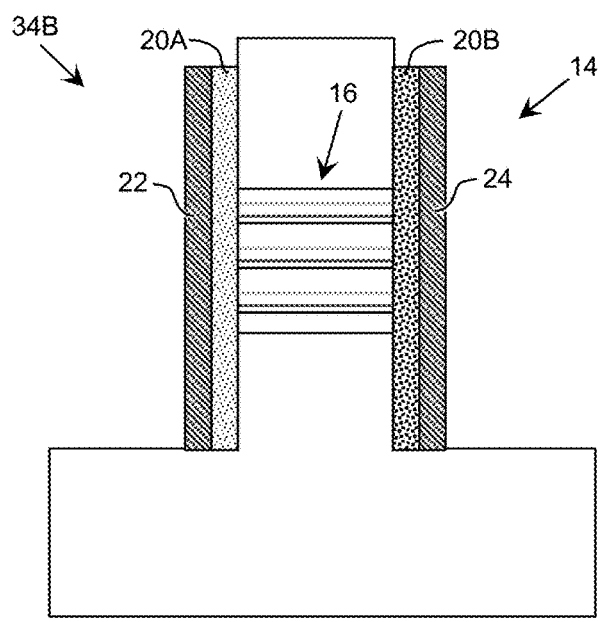

FIGS. 6A and 6B show variations of devices 34A, 34B, respectively, having a mesa 14 with lateral current injection according to embodiments. In each case, metal contacts 22, 24 are formed adjacent to the semiconductor contact layers 20A, 20B, respectively. In an embodiment, the angle of the slanted sides of the mesa 14 shown in FIG. 6A can be selected to improve light extraction and/or absorption characteristics of the mesa. The device 34B is shown including a mesa 14 having vertical sidewalls, which can be easier to manufacture.

In each case, the mesa 14 can include a single active region 16, which can be configured to simultaneously emit or detect multiple wavelengths of radiation. For example, the active region 16 can comprise a multiple quantum well structures with subsets of quantum wells configured to emit or detect different wavelengths of radiation. Furthermore, the active region 16 can include interlayers, which can be configured to improve stress management of the corresponding device 34A, 34B. The interlayers can comprise semiconductor layers having a sub-nanometer thickness, such as a few atomic layers. In general, the composition of the interlayers can be chosen to differ from neighboring layers to provide a lattice mismatch that can be used for stress control for neighboring semiconductor layers. In an embodiment, the active region 16 can comprise group III nitride semiconductor layers comprising AlInBGaN semiconductors with the selected molar fractions of each semiconductor material configured for optimal emission or detection characteristics of the layer.

While the devices 32, 34A, 34B are each shown including a single mesa 14, it is understood that embodiments of a device described herein can include any number of mesas. Additionally, one or more of the mesas can include semiconductor contact layers 20A, 20B formed on the sidewalls thereof, with current being injected laterally. To this extent, an embodiment of the device 10 shown in FIG. 1 can include mesas 14A-14C having semiconductor contact layers 20A, 20B formed on the sidewalls thereof as shown in conjunction with one or more of the devices 32, 34A, 34B.

Figure 7:
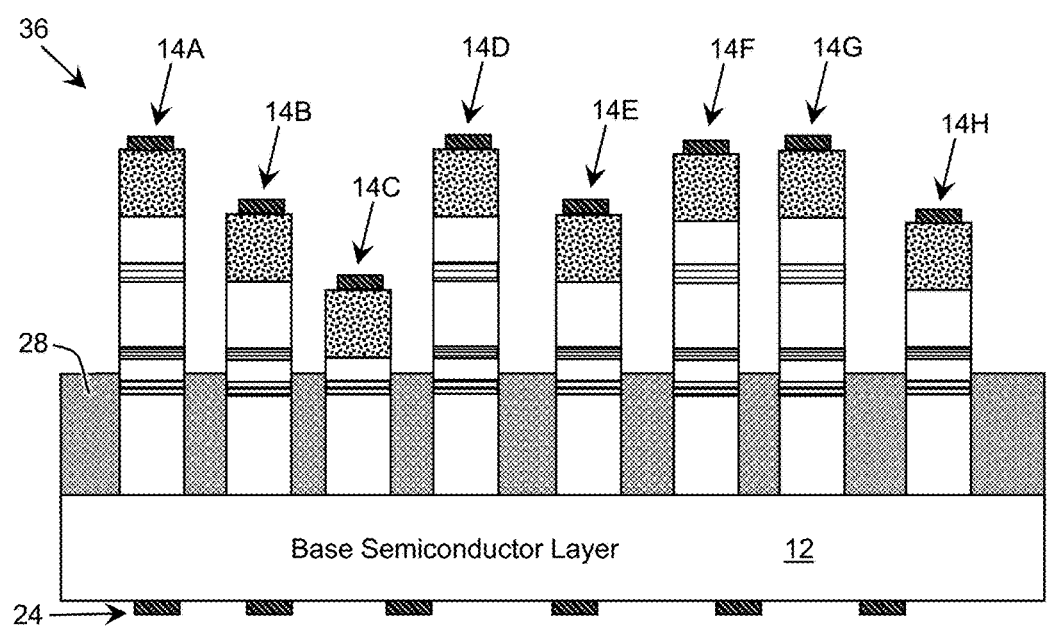
FIG. 7 shows still another device according to an embodiment.

FIG. 7 shows still another device 36 according to an embodiment. In this case, similar to the device 10 shown in FIG. 1, the device 36 includes several mesas 14A-14H, each of which can include one or more active regions, a semiconductor contact layer, and a metal contact (e.g., p-type), as described herein. In this embodiment, a plurality of metallic contacts 24 (e.g., n-type) are formed on an opposite side of the base semiconductor layer 12 as the mesas 14A-14H. While multiple metallic contacts 24 are shown, it is understood that any number of one or more metallic contacts 24 can be formed adjacent to the base semiconductor layer 12. When the base semiconductor layer 12 is fabricated on a substrate 11 (FIG. 1), the substrate can be detached using any solution, such as an appropriate lift-off process, prior to deposition of the metallic contacts 24. Additionally, the device 36 is shown including a protective layer 28, which can encapsulate at least a portion of the mesas 14A-14H. The protective layer 28 can be formed of any suitable dielectric material, such as silicon dioxide, silicon nitride, aluminum nitride, and/or the like.

In a more particular embodiment, the mesas 14A-14H can comprise nano- or micro-structures, such as nanowires. Each mesa 14A-14H can comprise a pyramid or other appropriate three-dimensional object, and can be fabricated using appropriate three-dimensional overgrowth techniques, through masking and overgrowth. through etching, and/or the like. The optoelectronic device 36 can have multiple active layers incorporated into the different nano-structure mesas 14A-14H. The use of nano-structure mesas 14A-14H can result in an improvement to the light extraction/absorption from/by the device 36.

Figure 8A:
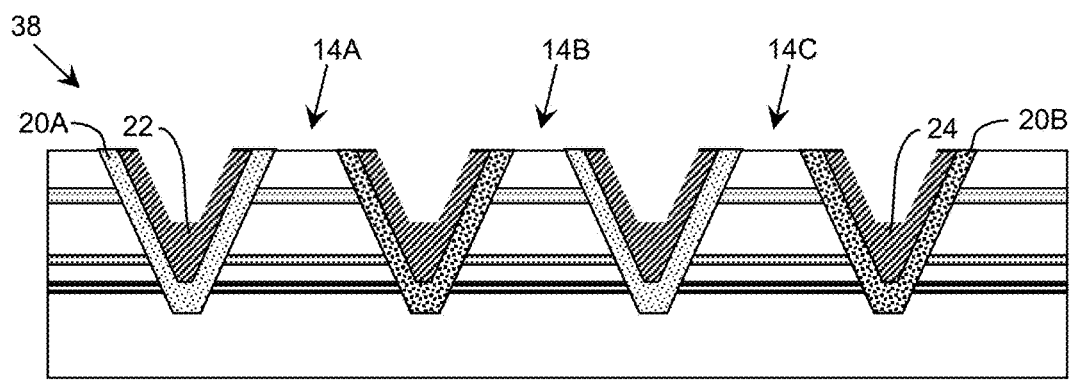
FIGS. 8A and 8B show illustrative two- and three-dimensional views, respectively, of illustrative portions of an optoelectronic device according to an embodiment.
Figure 8B:
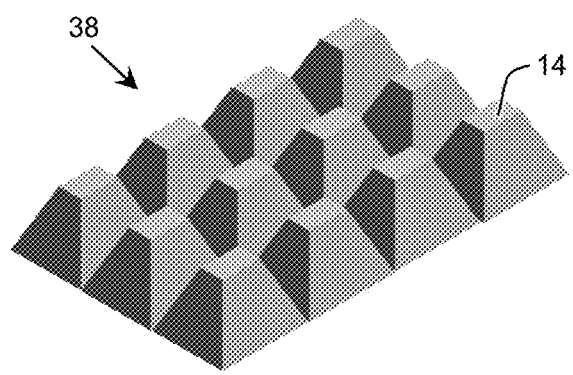

FIGS. 8A and 8B show illustrative two- and three-dimensional views, respectively, of illustrative portions of an optoelectronic device 38 according to an embodiment. In this embodiment, the mesas 14, such as the mesas 14A-14C shown in FIG. 8A, can comprise one or more laterally injected active regions. In an embodiment, the mesas 14A-14C are fabricated through patterning followed by layer deposition. For example, the patterning can be first performed of the semiconductor heterostructure to result in mesas 14A-14C using photolithography and etching, followed by deposition of layers 20A and 20B.

Subsequently, an n-type semiconductor contact layer 20A or a p-type semiconductor contact layer 20B can be deposited into the valleys located between the mesas 14A-14C. As illustrated, the n-type and p-type semiconductor contact layers 20A, 20B can be deposited such that each valley includes only a single type of semiconductor contact layer and each mesa 14A-14C is adjoined by both types of semiconductor layers 20A, 20B. To this extent, the n-type and p-type semiconductor contact layers 20A, 20B can be deposited in alternating valleys located between the mesas 14A-14C. Subsequently, the n-type and p-type metal contacts 22, 24, respectively, can be deposited over the corresponding n-type and p-type semiconductor contact layers 20A, 20B.

An embodiment provides a system that includes one or more optoelectronic devices described herein. For example, an optoelectronic device described herein can be utilized as an emitter, and can be operated in conjunction with one or more detectors. Alternatively, an optoelectronic device described herein can be utilized as a detector, and can be operated in conjunction with one or more emitters. A more particular embodiment provides a system that includes multiple optoelectronic devices described herein. In such a system, one or more of the optoelectronic devices can be configured to operate as an emitter, while one or more of the optoelectronic devices can be configured to operate as a detector. However, it is understood that embodiments of a system can include multiple optoelectronic devices described herein that are configured to be operated only as one of emitters or detectors.

Figure 9:
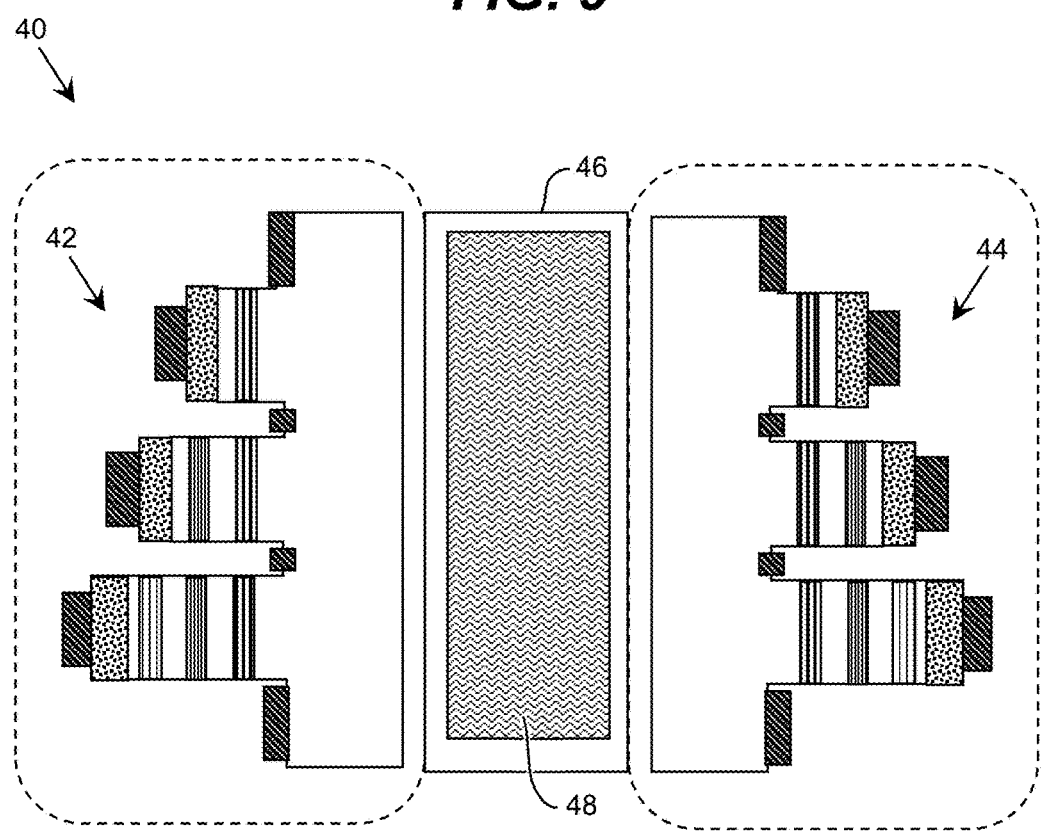
FIG. 9 shows an illustrative system including an optoelectronic device configured to be operated as an emitter and an optoelectronic device configured to be operated as a detector according to an embodiment.

FIG. 9 shows an illustrative system 40 including a first optoelectronic device 42 configured to be operated as an emitter (e.g., a laser) and a second optoelectronic device 44 configured to be operated as a detector according to an embodiment. The system 40 is further shown including a channel region 46, to which the optoelectronic devices 42, 44 can be attached. During operation of the system 40, the emitter 42 can emit radiation having a first set of peak wavelengths and the detector 44 can detect radiation having a second set of peak wavelengths. The radiation emitted by the emitter 42 can be directed into the channel region 46, which can include a medium 48 that emits a fluorescent signal in response to the radiation. The detector 44 can be configured to detect the resulting fluorescent signal excited by the radiation. The detected fluorescent signal can be processed to analyze one or more (e.g., optical, photoluminescence, and/or the like) properties of the medium 48. For example, the medium 48 can comprise a fluorescent liquid to be evaluated, which is flowing through the channel region 46, such as urine or another fluorescent liquid.

The peak wavelength(s) for each device 42, 44 can be the same or some or all of the peak wavelengths can differ. To this extent, the active regions of the detector 44 can differ from the active regions of the emitter 42. Additionally, while each device 42, 44 is shown having a configuration similar to the optoelectronic device shown in FIG. 1, it is understood that each device 42, 44 can have any configuration as described herein and both devices 42, 44 can have different configurations.

Figure 10:
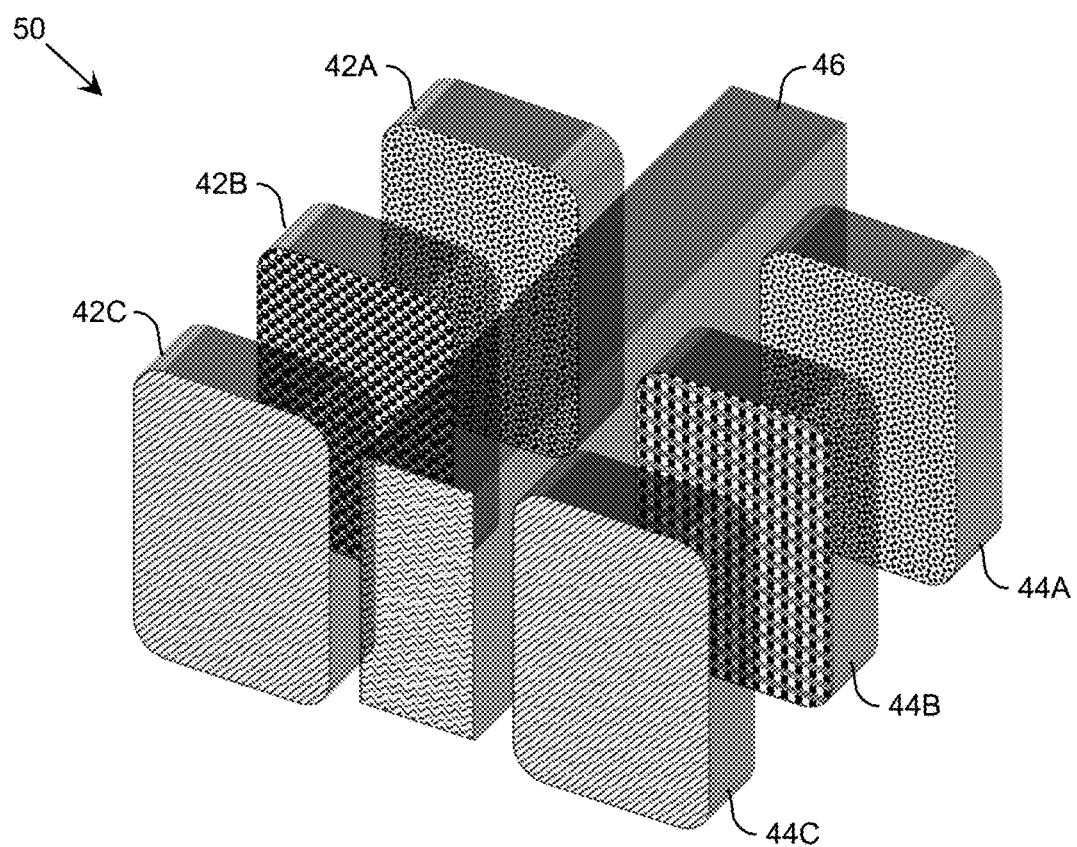
FIG. 10 shows a three-dimensional view of an illustrative system, which includes three emitters and three detectors all of which are coupled to a channel region, according to an embodiment.

While the system 40 is shown including two optoelectronic devices 42, 44, it is understood that embodiments of a system described herein can include any number of optoelectronic devices 42, 44. For example, FIG. 10 shows a three-dimensional view of an illustrative system 50, which includes three emitters 42A-42C and three detectors 44A-44C all of which are coupled to a channel region 46, according to an embodiment. In this case, each emitter 42A-42C can be configured to excite a fluorescent signal in a medium located in the channel region 46, which can be detected by a corresponding detector 44A-44C. While the system 50 is shown including emitters and detectors implemented in a one-to-one correspondence, it is understood that this need not be the case and embodiments of a system described herein can include a different number of emitters and detectors. Furthermore, it is understood that the arrangement of emitters and detectors shown in the system 50 is only illustrative and any suitable arrangement of emitters and detectors can be implemented.

Figure 11A:
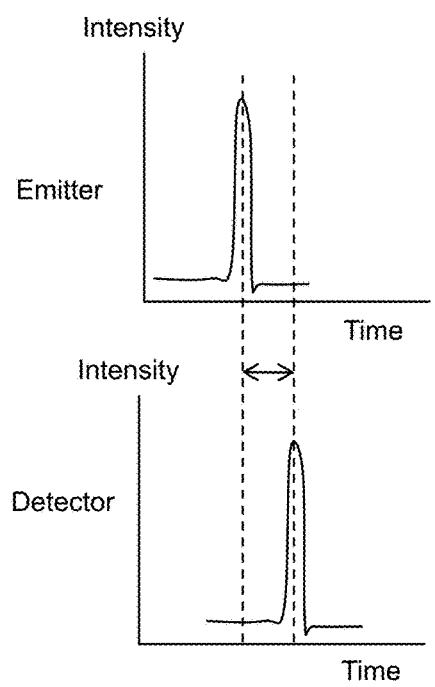
FIGS. 11A and 11B show two illustrative time dependent operation of an emitter and detector in a system according to embodiments.
Figure 11B:
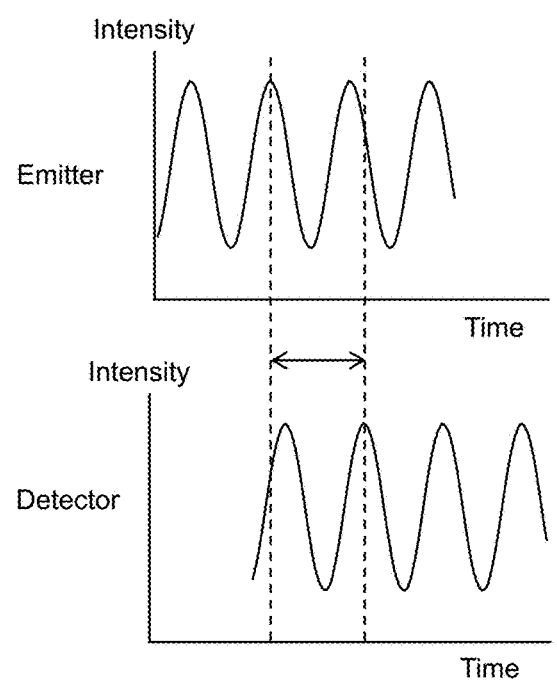

The emitter(s) and detector(s) in a system described herein can be operated in using any of various operation protocols. In an embodiment, the emitter(s) and detector(s) are operated using any one of various time dependent operation protocols, which can enable time dependent fluorescent analysis. To this extent, FIGS. 11A and 11B show two illustrative time dependent operation of an emitter and detector in a system according to embodiments. As illustrated in FIG. 11A, the emitter can release a pulse of radiation having a particular wavelength or multiple wavelengths as a first time. Subsequently, the detector can analyze a time dependent fluorescent signal that is generated in response to the pulse. One or more attributes of the detected fluorescent signal, such as the time shift of the signal, can be analyzed. The time shift corresponds to the time passed between initial excitation and the resulting fluorescent response, and can be indicative of one or more properties of the substance being analyzed. As shown in FIG. 11B, the emitter an operate in a time periodic manner to emit radiation having varying intensity over time and the detector can detect a periodic fluorescent signal, which results from the emitted radiation. One or more attributes of the detected fluorescent signal, such as the phase shift of the signal, can be analyzed. The phase shift is similar to the time shift, but for periodic excitation, and also can be indicative of one or more properties of the substance being analyzed.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 12:
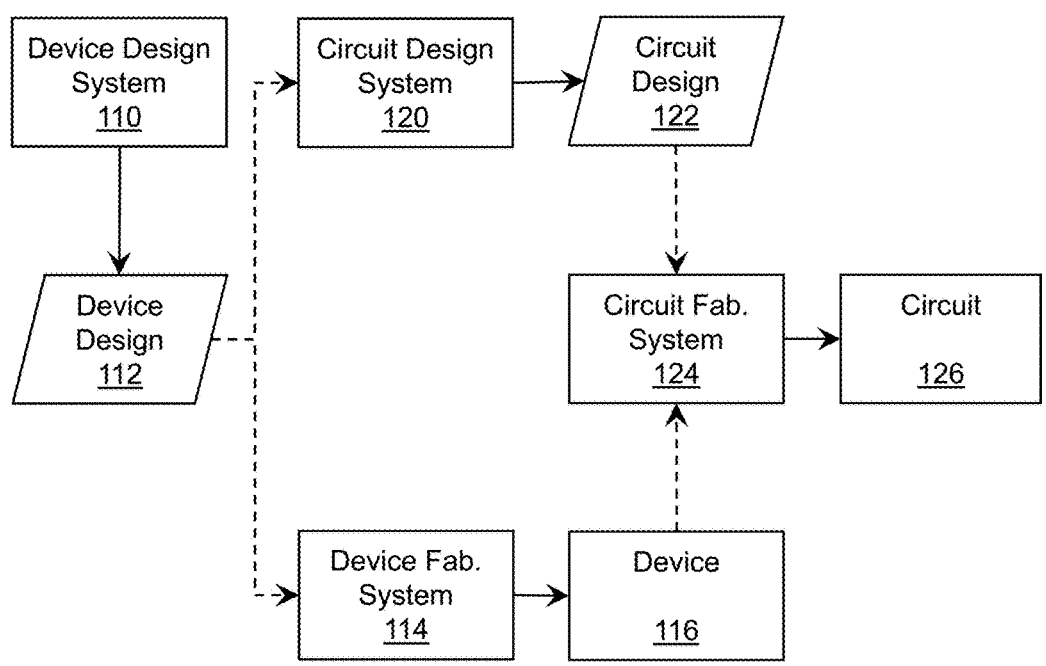
FIG. 12 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 12 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A tandem optoelectronic device comprising:
a light emitter configured to emit radiation at multiple wavelengths, the light emitter including:
a base semiconductor layer having a semiconductor heterostructure mesa located on a first surface of the base semiconductor layer,
wherein the mesa includes a plurality of active regions, and
wherein the plurality of active regions include:
a first active region having a first main peak of radiative recombination at a first wavelength and a first full width at half maximum; and
a second active region having a second main peak of radiative recombination at a second wavelength and a second full width at half maximum, wherein the first wavelength and the second wavelength differ by at least a larger of the first full width at half maximum or the second full width at half maximum;
a light detector configured to operate in conjunction with the light emitter; and
a channel region operatively coupled to both the light emitter and the light detector;
wherein the channel region excites a fluorescent signal in response to radiation emitted from the light emitter,
wherein the light detector detects the fluorescent signal excited by the radiation, and wherein the light detector analyzes the detected fluorescent signal.

2. The device of claim 1, wherein the base semiconductor layer includes a plurality of physically separate semiconductor heterostructure mesas located thereon.

3. The device of claim 1, wherein the mesa further includes:
a first semiconductor contact layer to the first active region; and
a second semiconductor contact layer to the second active region, wherein the second semiconductor contact layer is located within the mesa at a location below the first active region.

4. The device of claim 3, wherein the mesa further includes:
a first metal contact located directly on the first semiconductor contact layer;
a second metal contact located directly on the second semiconductor contact layer; and
a dielectric material located between the second metal contact and the first active region.

5. The device of claim 1, further comprising a set of metal contacts located on the first surface of the base semiconductor layer.

6. The device of claim 1, further comprising a set of metal contacts located on a second surface of the base semiconductor layer opposite the first surface.

7. The device of claim 1, the mesa further including:
an n-type semiconductor contact layer located adjacent to a first side surface of the mesa; and
a p-type semiconductor contact layer located adjacent to a second side surface of the mesa, wherein the second side surface is different from the first side surface, and wherein the n-type semiconductor contact layer and the p-type semiconductor contact layer contact each of the plurality of active regions.

8. The device of claim 7, further comprising a metallic contact formed on each of the n-type semiconductor contact layer and the p-type semiconductor layer.

9. The device of claim 1, wherein at least one of the plurality of active regions includes a plurality of interlayers, with each interlayer having a composition that provides a lattice mismatch with a neighboring layer.

10. The device of claim 7, wherein each of the first and second side surfaces of the mesa forms an angle between approximately ten and approximately eighty degrees with normal to the first surface of the base semiconductor layer on which the mesa is located.

11. The device of claim 1, wherein the mesa includes a plurality of cavities formed therein, each cavity extending downward from a top surface of the mesa to a depth that is just above one of the plurality of active regions.

12. The device of claim 11, wherein each cavity includes a contact layer formed in a bottom portion thereof, wherein the contact layer is form over a corresponding active region.

13. The device of claim 12, wherein each cavity further includes a metal contact formed over the contact layer.

14. The device of claim 13, wherein each cavity further includes a dielectric material formed against each sidewall of the cavity, wherein the dielectric material is formed on the contact layer and the metal contact.

15. The device of claim 8, wherein the mesa is configured to receive current injected laterally through the metallic contacts and the n-type semiconductor contact layer and the p-type semiconductor layers.

16. A system comprising:
a first optoelectronic device comprising:
a base semiconductor layer having a semiconductor heterostructure mesa located on a first surface of the base semiconductor layer,
wherein the mesa includes a plurality of active regions, and
wherein the plurality of active regions include:
a first active region having a first main peak of radiative recombination at a first wavelength and a first full width at half maximum; and
a second active region having a second main peak of radiative recombination at a second wavelength and a second full width at half maximum, wherein the first wavelength and the second wavelength differ by at least a larger of the first full width at half maximum or the second full width at half maximum;
a second optoelectronic device, wherein one of the first or second optoelectronic devices is configured to be operated as an emitter and the other of the first or second optoelectronic devices is configured to be operated as a detector; and
a channel region operatively coupled to both the first optoelectronic device and the second optoelectronic device, the channel region having a medium that excites a fluorescent signal in response to radiation directed to the medium from the optoelectronic device configured to operate as the emitter, wherein the optoelectronic device configured to operate as the detector detects the fluorescent signal excited by the radiation.

17. The system of claim 16, wherein the second optoelectronic device includes:
a second base semiconductor layer having a second semiconductor heterostructure mesa located on a first surface of the second base semiconductor layer,
wherein the second mesa includes a second plurality of active regions, and
wherein the second plurality of active regions include:
a third active region having a third main peak of radiative recombination at a third wavelength and a third full width at half maximum; and
a fourth active region having a fourth main peak of radiative recombination at a fourth wavelength and a fourth full width at half maximum, wherein the third wavelength and the fourth wavelength differ by at least a larger of the third full width at half maximum or the fourth full width at half maximum.

18. The system of claim 16, wherein the optoelectronic device of the first optoelectronic device and the second optoelectronic device configured to operate as the detector is further configured to analyze the fluorescent signal to ascertain properties of the medium in the channel region.

19. The system of claim 16, wherein the optoelectronic device of the first optoelectronic device and the second optoelectronic device configured to operate as the emitter, is further configured to release a pulse of radiation having a particular wavelength or a multiple of wavelengths at a first time, and the other optoelectronic device of the first optoelectronic device and the second optoelectronic device configured to operate as the detector is further configured to detect and analyze a time dependent fluorescent signal excited from the medium in response to the pulse of radiation, wherein the detector is configured to determine one or more attributes associated with the detected time dependent fluorescent signal, wherein the one or more attributes is indicative of one or more properties of the medium in the channel region.

20. A tandem optoelectronic device comprising:
- a light emitter configured to emit radiation at multiple wavelengths, comprising:
  - a substrate;
  - a buffer layer formed on the substrate;
  - a semiconductor heterostructure mesa formed on the buffer layer, wherein the mesa includes a plurality of active regions, with at least one active region formed from a series of alternating quantum wells and barriers, wherein the plurality of active regions include:
    - a first active region having a first main peak of radiative recombination at a first wavelength and a first full width at half maximum; and
    - a second active region having a second main peak of radiative recombination at a second wavelength and a second full width at half maximum, wherein the first wavelength and the second wavelength differ by at least a larger of the first full width at half maximum or the second full width at half maximum;
- a light detector configured to operate in conjunction with the light emitter; and
- a channel region operatively coupled to both the light emitter and the light detector;
- wherein the channel region excites a fluorescent signal in response to radiation emitted from the light emitter,
- wherein the light detector detects the fluorescent signal excited by the radiation, and
- wherein the light detector analyzes the detected fluorescent signal.

* * * * *